United States Patent [19]
Iwai et al.

[11] Patent Number: 5,854,090
[45] Date of Patent: *Dec. 29, 1998

[54] METHOD OF MANUFACTURING WAFER BONDED SEMICONDUCTOR LASER DEVICE

[75] Inventors: Norihiro Iwai; Akihiko Kasukawa, both of Tokyo, Japan

[73] Assignee: The Furukawa Electric Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 768,575

[22] Filed: Dec. 16, 1996

[30] Foreign Application Priority Data

Dec. 15, 1995 [JP] Japan .................................. 7-326962

[51] Int. Cl.$^6$ .......................... H01L 21/20; H01L 21/306
[52] U.S. Cl. ................................. 438/47; 438/46
[58] Field of Search ................................. 372/43, 44, 45; 438/455, 459, 46, 47

[56] References Cited

U.S. PATENT DOCUMENTS 5,207,864  5/1993  Bhat et al. .
5,376,580  12/1994  Kish et al. .
5,724,376  3/1998  Kish et al. .

*Primary Examiner*—Charles L. Bowers, Jr.
*Assistant Examiner*—Keith Christianson
*Attorney, Agent, or Firm*—Helfgott & Karas, P.C.

[57] ABSTRACT

This invention gives birth to a semiconductor laser device which is equipped with a semiconductor substrate, a laser active layer with a first bandgap energy overlying the preceding semiconductor substrate, and a p-type cladding layer and an n-type cladding layer between which the preceding active layer is interposed. In addition, the referenced p-type cladding layer has a second bandgap energy exceeding 1.35 eV and remaining greater than the first bandgap energy. Direct bonding technique is adopted for fabricating the semiconductor laser device in question in place of epitaxial growth technique, because the cladding layer and active layer differ in lattice constant.

9 Claims, 8 Drawing Sheets

METHOD OF MANUFACTURING WAFER BONDED SEMICONDUCTOR LASER DEVICE

BACKGROUND OF THE INVENTION a) Field of the Invention

The present invention relates to a semiconductor laser device and a method of manufacturing the same. In particular, the present invention relates to a long wavelength semiconductor laser device in which either the bandgap energy of a p-type cladding layer is selected to exceed 1.35 eV and to remain greater than the bandgap energy of an active layer or the bandgap energies of both p- and n-type cladding layers are selected to exceed 1.35 eV and to remain greater than the bandgap energy of an active layer, so as to impede an overflow of electrons from the active layer into the cladding layer or layers, thereby improving a temperature characteristic of the semiconductor laser device. The present invention also relates to a method of manufacturing such a semiconductor laser device.

b) Description of the Related Art

A long wavelength semiconductor laser device which is made of InP based compound semiconductor materials exhibits poor temperature characteristics as compared with a short wavelength semiconductor laser device which is made of GaAs based compound semiconductor materials. This drawback is caused by Auger recombination. The problem of the Auger recombination is solved to some extent by use of a strained layer quantum wells (SL-QW) in the active layer. However, the problem overflow of electrons into the cladding layer (referred to as electron overflow problem hereinafter) is not solved so far.

To solve the electron overflow problem, it is known to be effective that the bandgap energy of the cladding layer adjusts to being much larger than the bandgap energy of the active layer. However, semiconductor materials which have different bandgap energies, in general, differ mutually in lattice constant. Accordingly, it is difficult to achieve a consecutive epitaxial growth of an active layer and a cladding layer which have considerably different bandgap energies. Consequently, this configuration is not employed in an actual semiconductor laser device.

SUMMARY OF THE INVENTION

In view of the above, it is an object of the present invention to provide a long wavelength semiconductor laser device, in particular, made of InP based materials, in which the bandgap energy of a cladding layer is designed to be much larger than the bandgap energy of an active layer, and thus the electron overflow problem is alleviated to improve the temperature characteristic thereof. It is another object of the present invention to provide a method of manufacturing the same.

In accordance with the present invention, there is provided a semiconductor laser device comprising a semiconductor substrate, a laser active layer overlying the semiconductor substrate and having a first bandgap energy, and p-type cladding layer and an n-type cladding layer sandwiching the active layer, the p-type cladding layer having a second bandgap energy exceeding 1.35 eV and remaining greater than the first bandgap energy for obtaining an excellent laser characteristic.

In the semiconductor laser device as described above, the n-type cladding layer may have a third bandgap energy exceeding 1.35 eV and remaining greater than the bandgap energy of the active layer.

In a preferred embodiment of the present invention wherein the bandgap energy of the p-type cladding layer exceeds 1.35 eV and remains greater than the bandgap energy of the active layer, the p-type cladding layer is made of a compound selected from a group consisting of gallium phosphide (GaP), indium gallium phosphide (InGaP), indium gallium arsenic phosphide (InGaAsP), aluminum arsenide (AlAs), aluminum gallium arsenide (AlGaAs) and aluminum gallium indium arsenide (AlGaInAs). The n-type cladding layer is preferably made of indium phosphide (InP).

In a preferred embodiment according to the present invention wherein each of the p- and n-type cladding layer has a bandgap energy which exceeds 1.35 eV and remains greater than the bandgap energy of the active layer, both the p-and n-type cladding layers are made of a material selected from a group consisting of GaP, InGaP, InGaAsP, AlAs, AlGaAs, AlGaInAs.

A method for manufacturing a semiconductor laser device according to a first aspect of the present invention provides a configuration wherein p-type cladding layer has a bandgap energy which exceeds 1.35 eV and remains greater than the bandgap energy of the active layer.

The method includes the steps of: forming consecutively an n-InP cladding layer, a semiconductor active layer and an InP based adhesive layer on a top surface of an n-InP substrate to overlay a first wafer; forming consecutively an etch-stop layer, a p-type contact layer and a p-type cladding layer on a GaAs substrate to overlay a second wafer; bonding the first and second wafers by contacting the adhesive layer and p-type cladding layer together and by a subsequent heat treatment to form a bonded wafer; removing consecutively the GaAs substrate and etch-stop layer from the bonded wafer; selectively removing a region of the p-type contact layer and a top portion of the p-type cladding layer other than a stripe region to form a mesa stripe; and forming a p-electrode on at least the p-type contact layer of the mesa stripe and an n-electrode on a bottom surface of the n-InP substrate.

In a preferred embodiment of the method according to the first aspect of the invention, the adhesive layer is made of a material selected from a group consisting of InP and InGaP, the etch-stop layer and p-contact layer are made of InGaP and p-GaAs, respectively, and the p-type cladding layer is made of a compound selected from a group consisting of GaP, InGaP, InGaAsP AlAs, AlGaAs and AlGaInAs.

A second method for manufacturing a semiconductor laser device according to a second aspect of the present invention provides a configuration wherein each of the p- and n-type cladding layer has a bandgap energy which exceeds 1.35 eV and remains greater than the bandgap energy of the active layer.

The second method includes the steps of: forming consecutively an etch-stop layer (e.g., InGaAs), a first adhesive layer (e.g., InP), a laser active layer and a second adhesive layer (e.g., InP) on a top surface of an InP substrate to overlay a first wafer; forming an n-type cladding layer (e.g., n-InGaP) on an n-GaAs substrate to overlay a second wafer; forming an etch-stop layer (e.g., InGaP), a p-type contact layer (GaAs) and a p-type cladding layer (e.g., InGaP) on a GaAs substrate to overlay a third wafer; bonding the first and second wafers by contacting the second adhesive layer and n-type cladding layer together and by a subsequent heat treatment to form a first bonded wafer; removing consecutively the n-InP substrate and etch-stop layer from the first bonded wafer to expose the first adhesive layer; bonding the first bonded wafer and third wafer together by contacting the exposed first adhesive layer and p-type cladding layer together and by a subsequent heat treatment to form a second bonded wafer; removing consecutively the GaAs substrate and etch-stop layer from the second bonded wafer; selectively etching a region of the p-type contact layer and a top portion of the p-InGaP cladding layer other than a stripe region to form a mesa stripe; and forming a p-electrode on at least the p-type contact layer of the mesa stripe and an n-electrode on a bottom surface of the n-InP substrate.

With the semiconductor laser device according to the present invention, the electron overflow problem is alleviated to improve the temperature characteristic of the semiconductor laser device. In the method of manufacturing a semiconductor laser device according to the invention, a direct bonding technique or substrate bonding technique provides a laminate structure in which layers having different bandgap energies can be laminated without any threading dislocations in spite of the different lattice constants to provide a semiconductor laser device of excellent characteristics. If the difference between the bandgap energies remains smaller than 1.35 eV, a satisfactory temperature characteristic of the semiconductor laser device cannot be obtained.

DESCRIPTION OF THE PREFERRED EMBODIMENTS

Referring to the drawings, semiconductor laser devices according to preferred embodiments of the present invention each manufactured by a process according an embodiment of the present invention are now described below.

First Embodiment

Figure 1:
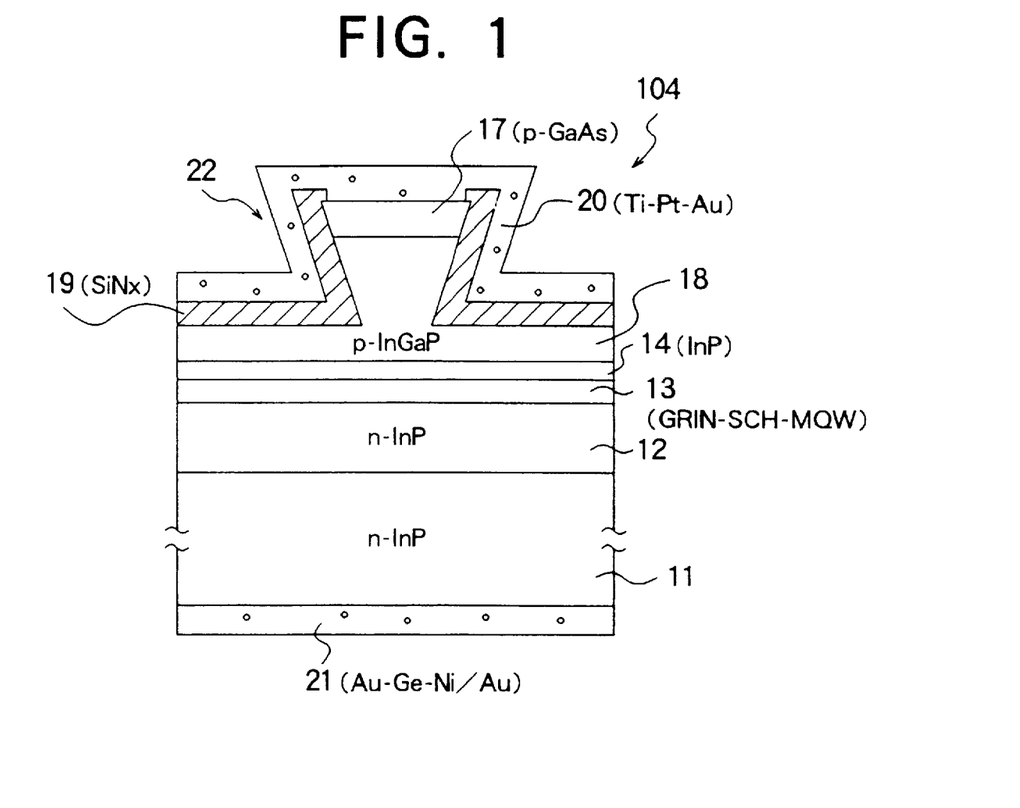
FIG. 1 is a cross-sectional view of a semiconductor laser device according to an embodiment of the present invention and manufactured by a process according to a first embodiment of the present invention.

Referring first to FIG. 1, a semiconductor laser device according to an embodiment has an n-InP substrate 11 and a laminate including n-InP cladding layer 12, a graded index separate confinement heterostructure multiple quantum well (GRIN-SCH-MQW) active layer 13 which oscillates at a wavelength of 1.3 $\mu$m, InP adhesive layer 14, p-InGaP cladding layer 18, p-GaAs contact layer 17 and a SiNx insulating layer 19 consecutively formed on the n-InP substrate 11. The semiconductor laser device further has electrodes formed on the top of the laminate and the bottom surface of the n-InP substrate 11, respectively. The stripe region of the p-GaAs layer 17 and the underlying top portion of the p-InGaP cladding layer 18 form a mesa stripe having an inverted mesa configuration. The bandgap energy of the p-InGaP cladding layer 18 exceeds 1.35 eV (for example, 1.9 eV) and remains greater than the bandgap energy of the active layer 13. The semiconductor laser device of FIG. 1 is manufactured by a process according to the first embodiment of the present invention as will be detailed below.

(First Step)

Figure 2:
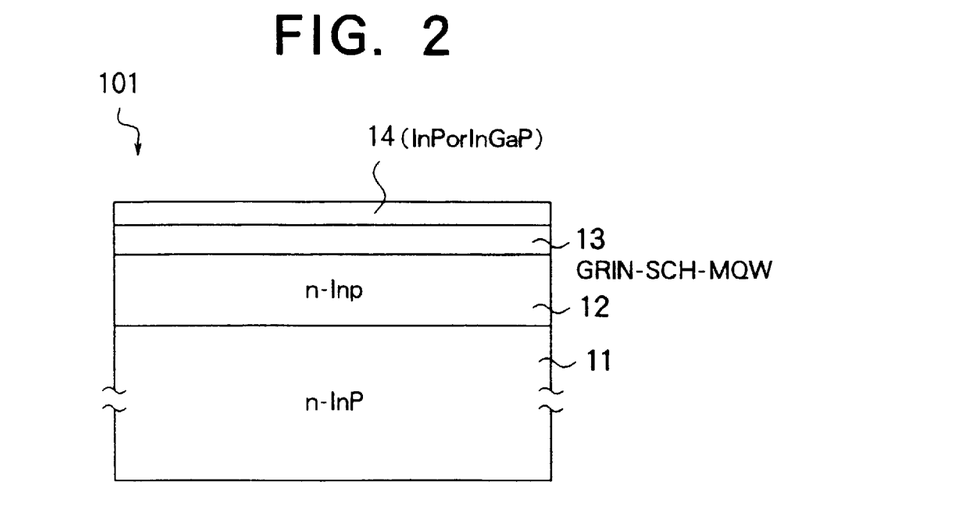
FIGS. 2 to 5 are longitudinal-sectional views of the semiconductor laser device of FIG. 1 at consecutive steps of a manufacturing process thereof.

Referring first to FIG. 2, an n-InP cladding layer 12, a GRIN-SCH-MQW active layer 13 which oscillates at 1.3 $\mu$, and an adhesive layer 14 made of either InP or InGaP are formed consecutively on a n-InP substrate 11 by using a MOCVD process to overlay a first wafer 101.

Subsequently, the first wafer 101 is treated using a processing solution containing $H_2SO_4$, $H_2O_2$, and $H_2O$ in admixture at a ratio of 3:1:1 and by hydrofluoric acid (HF).

(Second Step)

Figure 3:
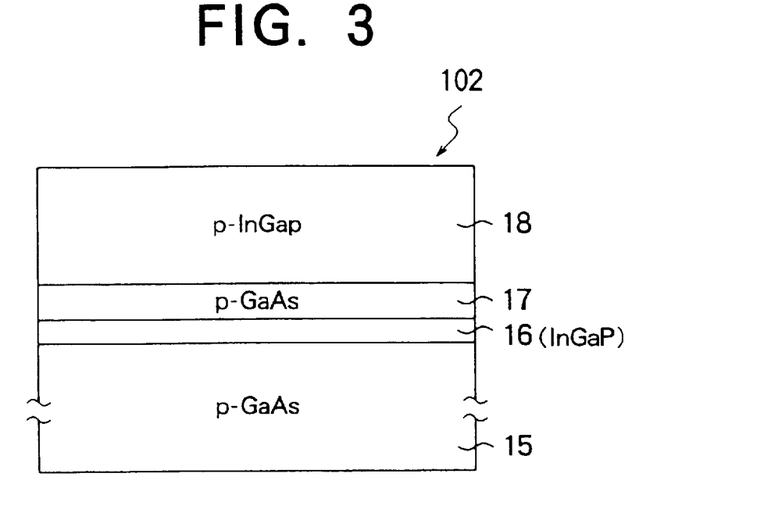

Referring next to FIG. 3, an InGaP etch-stop layer 16, a p-GaAs contact layer 17 and a p-InGaP cladding layer 18 are consecutively formed on a p-GaAs substrate 15 by using a MOCVD process to overlay a second wafer 102.

Subsequently, the second wafer 102 is treated by using a processing solution containing $H_2SO_4$, $H_2O_2$ and $H_2O$ in admixture at a ratio of 3:1:1 and by hydrofluoric acid.

(Third Step)

Figure 4:
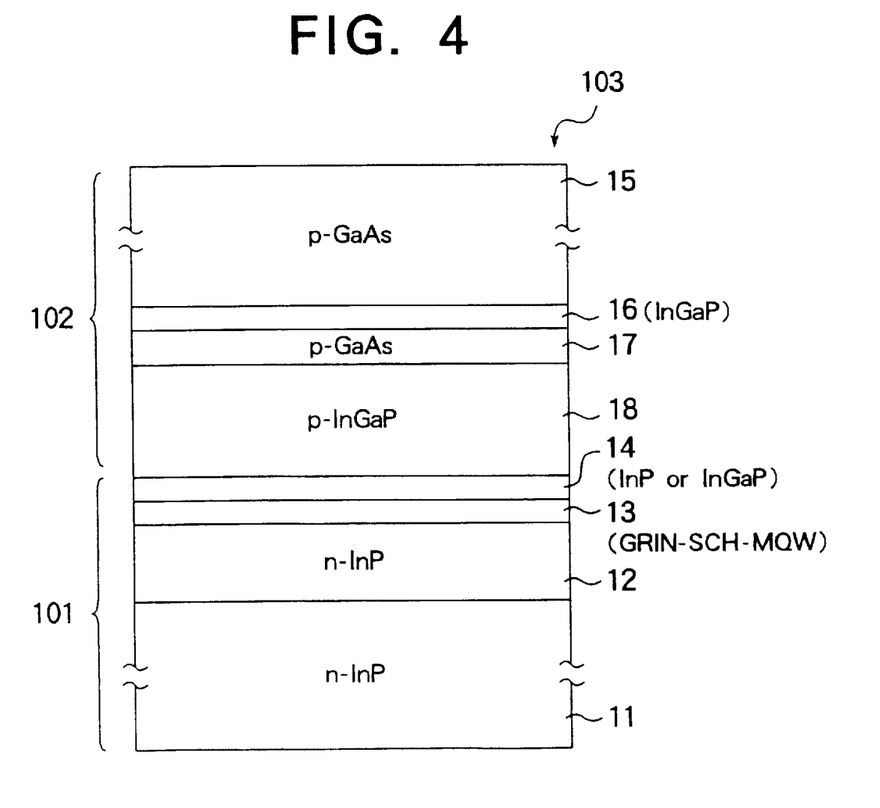

Referring to FIG. 4, the first wafer 101 and second wafer 102 are bonded together by a direct bonding process in which InP or InGaP adhesive layer 14 of the first wafer 101 and the p-InGaP cladding layer 18 of the second wafer 102 are placed in direct contact with each other in an atmospheric ambient. At this step, the cleaved faces of both the wafers are aligned with each other.

The p-InGaP cladding layer 18 is adhesively bonded to the adhesive layer 14 to form a bonded wafer or united wafer 103 by conducting a heat treatment of both the wafers 101 and 102 for thirty minutes at a temperature lower than 600° C., for example, at a temperature of about 500° C. while applying a pressure of a few dozens of grams, for example, 30 g/cm$^2$ by placing a Mo weight, which is generally free from contamination or other troubles.

(Fourth Step)

The GaAs substrate 15 is then removed from the bonded wafer 103 by dissolution using an etchant containing $NH_4OH:H_2O_2$. During this etching step, InGaP is scarcely dissolved in the etchant: accordingly, the etching can no longer proceed at the top surface, as viewed in FIG. 4, of the etch-stop layer 16.

Figure 5:
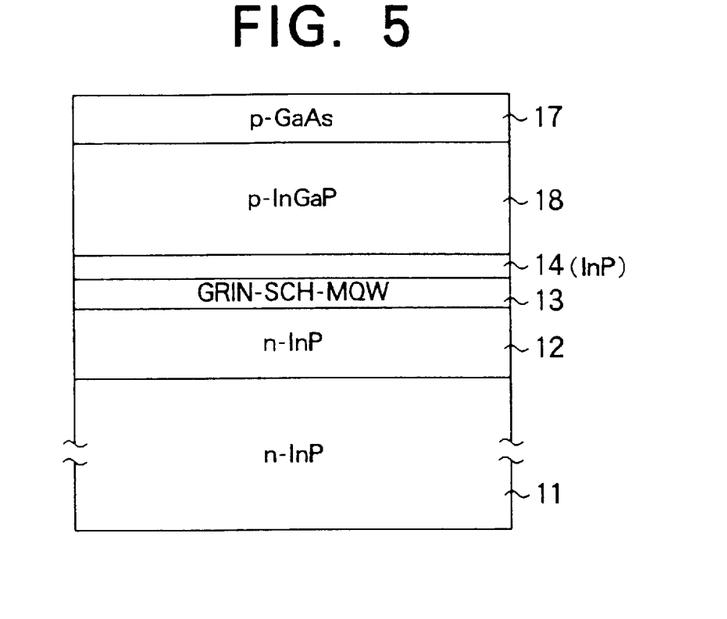

Referring to FIG. 5, the etch-stop layer 16 is then removed by dissolution using an etchant containing hydrochloric acid. During this etching step, GaAs is not dissolved in the hydrochloric acid: accordingly, the etching can no longer proceed at the top surface of the p-GaAs contact layer 17.

(Fifth Step)

Then, a sacrificial film made of SiNx is formed on the contact layer 17, and is removed except for a stripe region which has a width of about 5 microns ($\mu$m), as by using hydrofluoric acid, to thereby define an etching mask (not shown). By using the etching mask for the stripe region in combination with an etchant containing sulfuric acid and another etchant containing hydrochloric acid, the laminate portion from the p-GaAs contact layer 17 to a top portion of the p- InGaP cladding layer 18 is removed except for the stripe region by dissolution, whereby the p-GaAs contact layer 17 and the top portion of the p-InGaP cladding layer 18 are left as a mesa stripe 22 or ridge, as shown in FIG. 1, having an inverted mesa configuration. The bottom of the mesa stripe has a width of about 2 $\mu$m.

Thereafter, a SiNx film 19 for insulation is formed on the mesa stripe 22 and on the top surface of the remaining p-InGaP cladding layer 18, followed by removal of the SiNX film from the top of the mesa stripe 22 while leaving the same on the side surfaces of the mesa stripe 22 and on the remaining p-InGaP cladding layer 18.

The bottom surface of the n-InP substrate 11 is then polished to reduce its thickness to the order of 100 µm. Subsequently, a p-electrode 20 containing Ti—Pt—Au is formed on the contact layer 17 of the mesa stripe 22 and on the SiNx film 19, and a n-electrode 21 containing Au—Ge—Ni/Au is formed on the bottom surface of the n-InP substrate 11.

Subsequently, the laminate structure is cleaved in a direction perpendicular to the mesa stripe 22 so that the cavity length of the resultant semiconductor laser device can adjust to some 300 µm, and is then cut along the mesa stripe 22 to a width of about 200 µm, thereby finishing the semiconductor laser device 104 of FIG. 1.

The semiconductor laser device manufactured by the process described above is configured to have the p-InGaP cladding layer 18 with a bandgap energy, being considerably larger than the bandgap energy of the active layer 13, where the electron overflow problem can be alleviated; the temperature characteristics of the semiconductor laser device can be improved.

Although the lattice constant of the p-InGaP cladding layer 18 differs significantly from the lattice constant of the active layer 13, the substrate bonding technique as used herein instead of the epitaxial growth technique provides an advantage that no substantial problem arises out of the difference of the lattice constant.

In the first embodiment, although the p-InGaP cladding layer 18 and InP adhesive layer 14 are bonded together, since InP and InGaP are similar materials, a modified interface layer formed between the cladding layer 18 and adhesive layer 14 has a desirable composition which has no adverse effects upon the laser characteristics.

It is preferable, however, the modified interface layer, as formed by mixing the p-InGaP and InP which exist adjacent to the modified interface layer, have a uniform composition with least possible variation. It is also preferable that those layers consecutively formed by epitaxial growth technique have a lattice constant which is extremely close to the lattice constant of the substrate on which those layers are epitaxially grown. That is, cladding layer 12 through the active layer 13 should have lattice constants close to that of n-InP substrate 11, while etch-stop layer 16 through p-cladding layer 18 should have lattice constants close to that of p-GaAs substrate 15, and both are met in the embodiment.

It should be noted that the layers bonded together need to have neither an equal composition nor similar lattice constants. This is because, if the modified interface layer does not absorb the laser wavelength generated by the active layer or if the bandgap energy of the modified interface layer exceeds 0.35 eV and remains greater than that of the active layer, there is no adverse effects upon the laser characteristics.

It should also be understood that the present invention is not limited to any specific construction of the active layer, a specific structure of the entire semiconductor laser device or the laser wavelength.

Second Embodiment

Another semiconductor laser device is formed by a process according to the second embodiment of the present invention shown in FIGS. 6 to 12.

(First Step)

Figure 6:
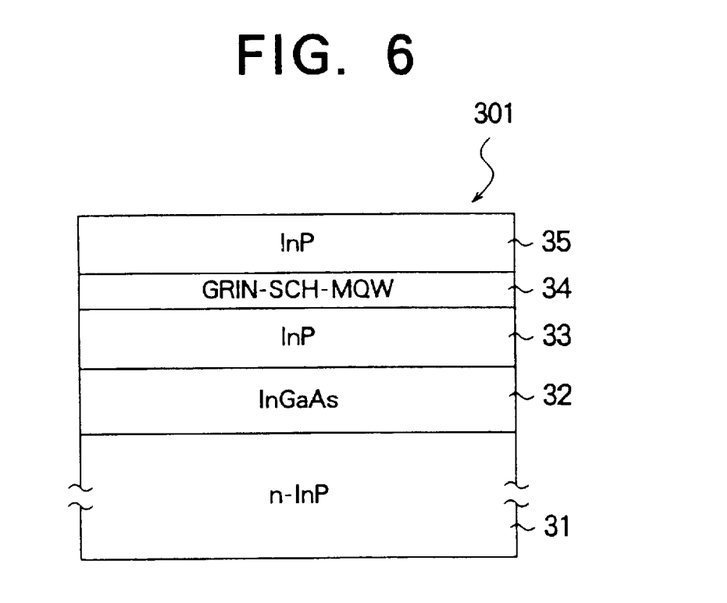
FIGS. 6 to 11 are longitudinal-sectional views of another semiconductor laser device at consecutive steps of a manufacturing process according to a second embodiment of the present invention.

Referring first to FIG. 6, an InGaAs etch-stop layer 32, a first InP adhesive layer 33, a GRIN-SCH-MQW active layer 34 which oscillates at a wavelength of 1.3 µm, and a second InP adhesive layer 35 are consecutively formed on an n-InP substrate 31 by using a MOCVD process to overlay a first wafer 301.

(Second Step)

Figure 7:
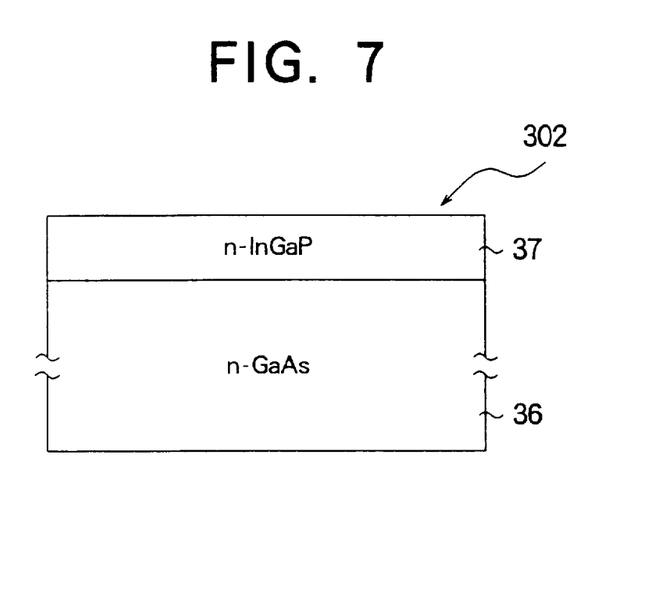

Referring next to FIG. 7, an n-InGaP cladding layer 37 is formed on an n-GaAs substrate 36 by using a MOCVD process to overlay a second wafer 302.

(Third Step)

Figure 8:
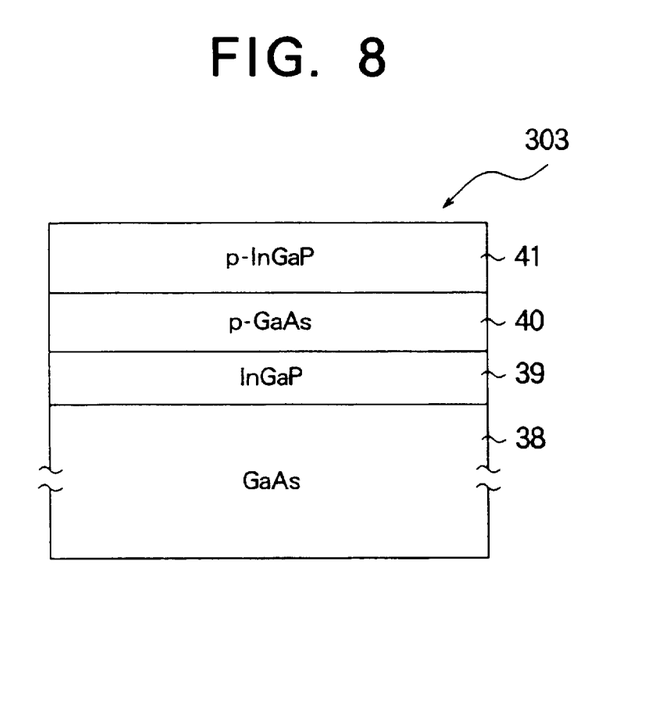

Referring to FIG. 8, an InGaP etch-stop layer 39, a p-GaAs contact layer 40 and a p-InGaP cladding layer 41 are consecutively grown on a GaAs substrate 38 by a MOCVD process to overlay a third wafer 303.

(Fourth Step)

Figure 9:
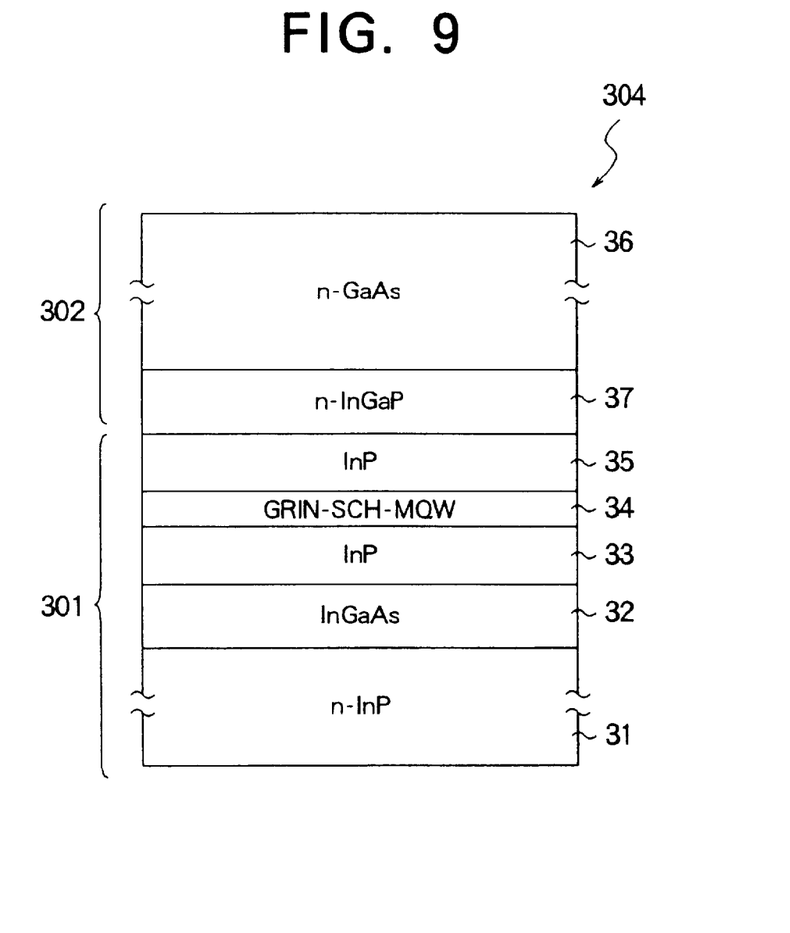

Referring to FIG. 9, the first and second wafers 301 and 302 are bonded by a direct bonding technique after a pretreatment of both the wafers 301 and 302 to overlay a first bonded wafer 304 in which the second InP adhesive layer 35 of the first wafer 301 and the n-InGaP cladding layer 37 of the second wafer 302 are placed in direct contact with each other in an atmospheric ambient. At this step, the cleaved faces of both the wafers 301 and 302 are brought in alignment and contact with each other.

Subsequently, a heat treatment of the first bonded wafer 304 is conducted for thirty minutes at a temperature lower than 600° C., for example, at a temperature of about 500° C., to stick the n-InGaP cladding layer 37 to the second InP adhesive layer 35 while applying a pressure of a few dozens of grams, for example, 30 g/cm$^2$ by placing a Mo weight, which is free from contamination or other troubles. By this step, the first bonded wafer 304 is completed.

(Fifth Step)

Figure 10:
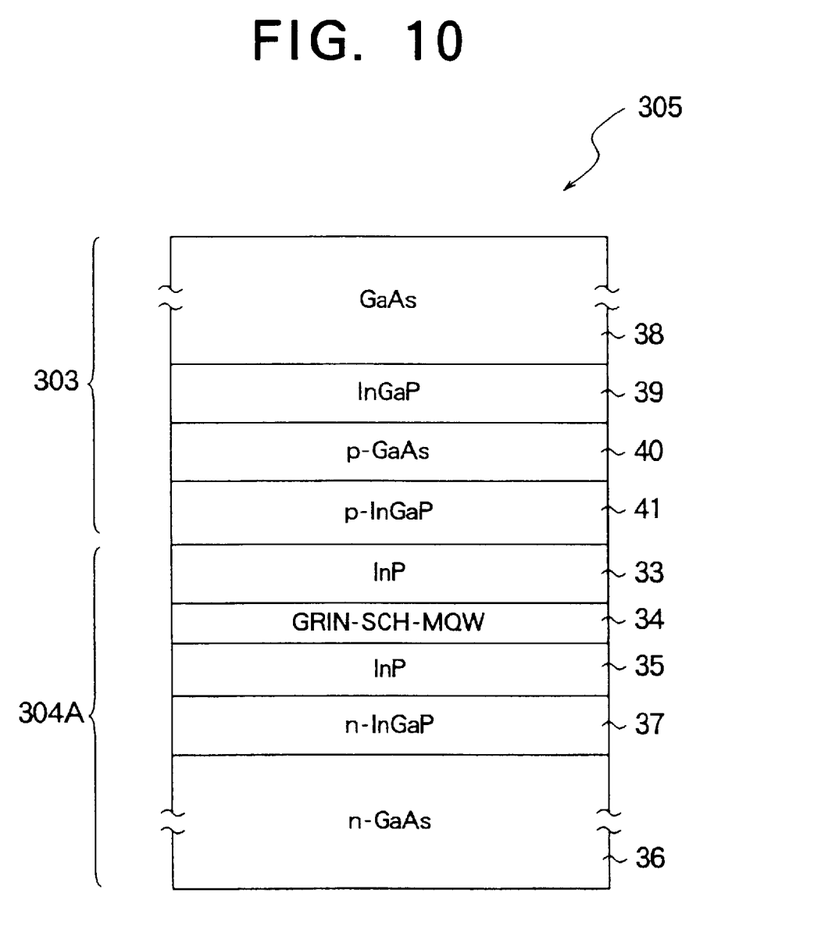

Referring next to FIG. 10, the n-InP substrate 31 and InGaAs etch-stop layer 32 are then removed from the first bonded wafer 304, followed by bonding the third wafer 303 onto the remaining first bonded wafer 304A to overlay a second bonded wafer 305 wherein the p-InGaP cladding layer 41 and exposed first InP adhesive layer 33 are placed in direct contact with each other in an atmospheric ambient. At this step, the cleaved faces of both the third wafer 303 and remaining first bonded wafer 304A are brought in alignment and contact with each other.

Subsequently, a heat treatment is conducted to the second bonded wafer 305 for thirty minutes at a temperature lower than 600° C., for example, at a temperature of about 500° C., to stick the n-InGaP cladding layer 37 to the second InP adhesive layer 35 while applying a pressure of a few dozens of grams, for example, 30 g/cm$^2$ by placing a Mo weight, which is free from contamination or other troubles . By this step, the second bonded wafer 305 is completed.

(Sixth Step)

Figure 11:
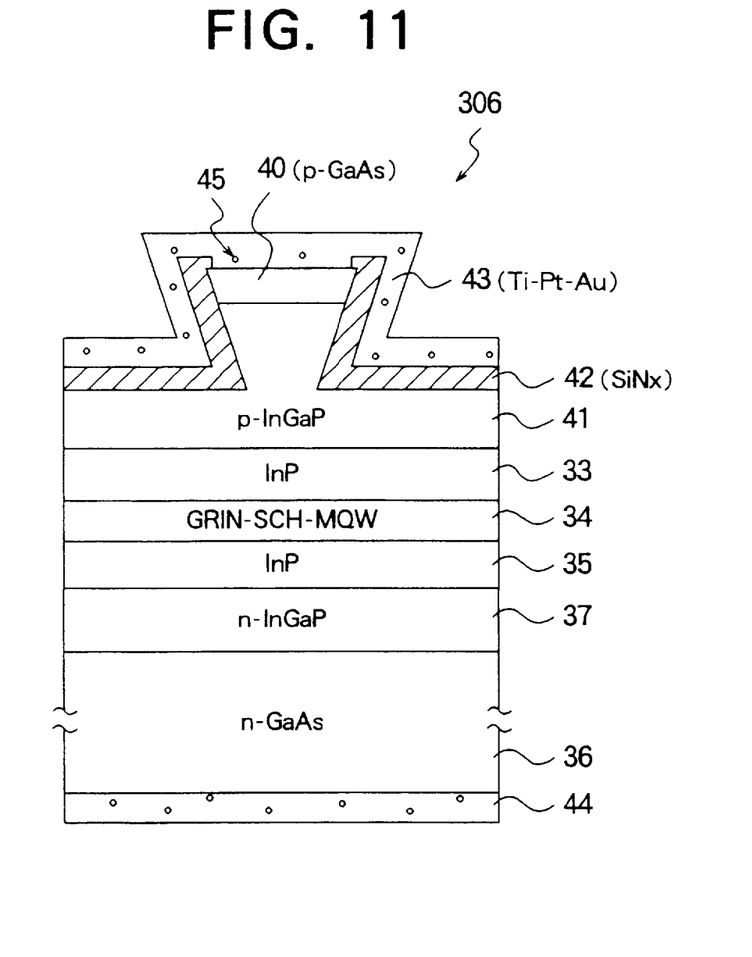

Referring to FIG. 11, the GaAs substrate 38 and the InGaP etch- stop layer 39 are removed from the second bonded wafer 305. Subsequently, a SiNx sacrificial film not shown here is formed on the exposed p-GaAs contact layer 40, followed by selective etching of the same by using hydrofluoric acid to form a stripe mask which has a width of about 5 µm. With the stripe mask as an etching mask, the p-GaAs contact layer 40 and the top portion of the p-InGaP cladding layer 41 are selectively removed by dissolution except for the masked stripe region, where a mesa stripe 45 having an inverted mesa takes shape. The bottom of the inverted mesa has a width of about 2 µm.

Thereafter, another SiNx film 42 for insulation is formed on the mesa stripe 45 and on the remaining p-InGaP cladding layer 41, followed by selective etching of the same to expose the top surface of the mesa stripe 45 while leaving untouched the SiNx film 42 at the side surface of the mesa stripe 45 and the p-InGaP cladding layer 41.

Subsequently, the bottom of the n-GaAs substrate 36 is polished to reduce its thickness down to about 100 μm, followed by forming a Ti—Pt—Au p-electrode 43 on the top surface of the contact layer 40 of the mesa stripe 45 and on the SiNx film 42, and an Au—Ge—Ni/Au n-electrode 44 on the bottom surface of the n-GaAs substrate 36, thereby overlaying a final wafer.

The final wafer is then cleaved in a direction perpendicular to the mesa stripe 45 so that the cavity length of the resultant semiconductor laser device can measure about 300 μm, and is then cut to a width of about 200 μm along the mesa stripe, thereby completing a final semiconductor laser device 306 as shown in FIG. 11.

In the semiconductor laser device manufactured by the steps described above, the bandgap energy of the p-InGaP cladding layer 41 and the bandgap energy of the n-InGaP cladding layer 37 are both considerably larger than the bandgap energy of the GRIN-SCH-MQW active layer 34. Accordingly, the electron overflow problem is alleviated to thereby improve the temperature characteristics of the semiconductor laser device.

In the second embodiment, although the lattice constants of both the p-InGaP cladding layer 41 and n-InGaP cladding layer 37 differ from the lattice constant of the active layer 34 by some extent, the direct bonding technique as used instead of an epitaxial growth technique provides an advantage that substantially no deficiency is involved in the difference of the lattice constants.

Again it should be understood that the present invention is not limited by a specific structure of the active layer or the entire semiconductor laser device or the laser wavelength.

Third Embodiment

Figure 12:
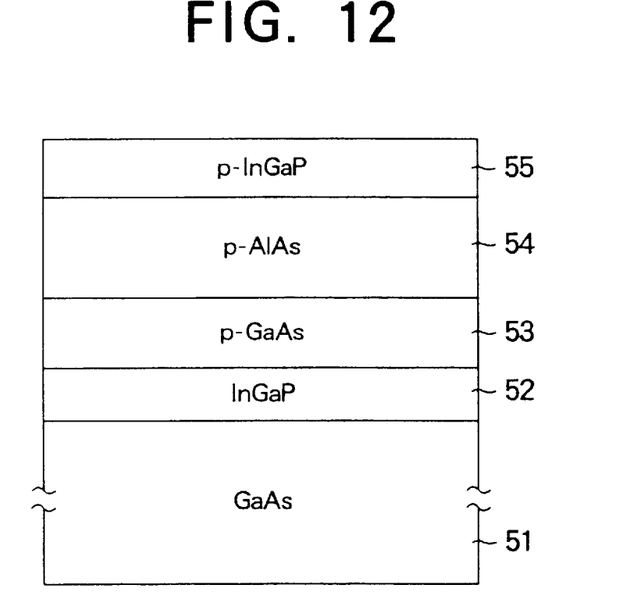
FIG. 12 is a longitudinal-sectional view of another semiconductor laser device manufactured by a process according to a third embodiment of the present invention.

Regardless of any material used in the cladding layer, the steps up to the direct bonding step in any embodiment of the present invention remain similar to the steps in the first and second embodiment wherein InGaP is used in the cladding layer. However, if a material containing Al is used in the laser device, such as shown in FIG. 12 showing a third embodiment, the surface of the material containing Al is apt to be oxidized. Accordingly, a protective film 55 made of InGaP exhibiting a less degree of oxidation should be used, as shown in FIG. 12. In this example, an InGaP etch-stop layer 52, a p-GaAs contact layer 53, an AlAs cladding layer 54, and the p-InGaP protective layer 55 are consecutively formed on a GaAS substrate 51 by a MOCVD process.

Fourth Embodiment

Figure 13:
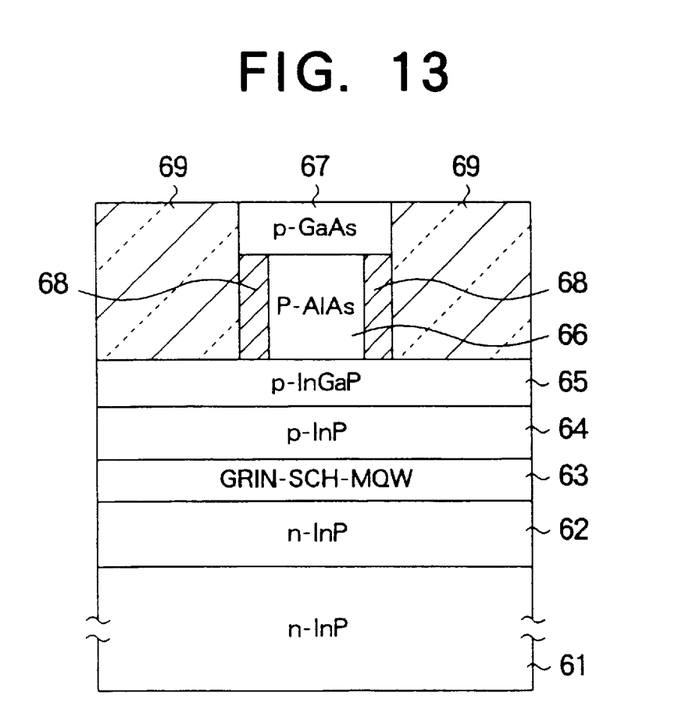
FIG. 13 is a longitudinal-sectional view of another semiconductor laser device manufactured by a process according to a fourth embodiment of the present invention.

When a material containing Al is used, it is possible to form a current confinement structure by utilizing the above described oxidation process itself. FIG. 13 illustrates an example of this structure. In the Figure, an n-InP cladding layer 62, a GRIN-SCH-MQW active layer 63, a p-InP adhesive layer 64, a p-InGaP layer 65, a p-AlAs cladding layer 66, and a p-GaAs contact layer 67 are consecutively arranged on an n-InP substrate 61. The ridge stripe of the p-AlAs cladding layer 66 and p-GaAs contact layer 67 are buried by a polyimide layer 69.

The method of manufacturing the semiconductor laser device of FIG. 13 includes, subsequently to the direct bonding step as described in connection with the preceding embodiments, the step of defining p-GaAs contact layer 67 and p-AlAs cladding layer 66 in a ridge stripe having a width of about 5 μm, followed by a heat treatment in an oxygen gas ambient, thereby forming AlAs oxidized regions 68 on both sides of the p-AlAs cladding layer 66. This allows only the width of the AlAs cladding layer 66 to be confined within a desired range while leaving the width of the p-GaAS contact layer intact.

Although the present invention is described with reference to preferred embodiments thereof, the present invention is not limited thereto and it will be apparent from those skilled in the art that various modifications or alterations can be easily made from the embodiments without departing from the scope of the present invention as set forth in the appended claims.

What is claimed is:

1. A method for manufacturing a semiconductor device comprising the steps of:

consecutively forming an n-InP cladding layer, a semiconductor active layer and an InP or InGaP adhesive layer on the top of an n-InP substrate to thereby overlay a first wafer;

consecutively forming an InGaP etch-stop layer, a p-GaAs contact layer and a p-InGaP or p-AlAs cladding layer on a GaAs substrate to thereby overlay a second wafer;

bonding said first and second wafers by setting said adhesive layer and said p-InGaP cladding layer coming in contact and by subsequent heat treatment to thereby form a united wafer;

consecutively removing said GaAs substrate and InGaP etch-stop layer from said united wafer;

selectively removing a region of said p-GaAs contact layer and a top portion of said p-InGaP cladding layer excluding a strip region to form a mesa stripe; and forming a p-electrode on at least said p-GaAs contact layer of said mesa stripe-and an n-electrode on a bottom surface of said n-InP substrate.

2. A method for manufacturing a semiconductor laser device comprising the steps of:

consecutively forming an InGaAs etch-stop layer, a first InP adhesive layer, a laser active layer and a second InP adhesive layer on an InP substrate to thereby overlay a first wafer;

forming an n-InGaP cladding layer on an n-substrate to thereby overlay a second wafer;

forming an InGaP etch-stop layer, a p-GaAs contact layer and a p-InGaP cladding layer on a GaAs substrate to thereby overlay a third wafer;

bonding said first and second wafers by setting said second InP adhesive layer and n-InGaP cladding layer coming in contact and by subsequent heat treatment to thereby form a first united wafer;

consecutively removing said n-InP substrate and InGaAs etch-stop layer from said first united wafer to thereby expose said first InP adhesive layer;

bonding said first united wafer and third wafer together by setting said exposed first InGaP adhesive layer and p-InP cladding layer coming in contact and by subsequent heat treatment to thereby form a second united wafer;

consecutively removing said GaAs substrate and InGaP etch-stop layer from said second united wafer;

selectively etching a region of said p-GaAs contact layer and a top portion of said p-InGaP cladding layer excluding a stripe region to form a mesa stripe; and forming a p-electrode on at least said p-GaAs contact layer of said mesa stripe and an n-electrode on a bottom surface of said n-InP substrate.

3. The method according to claim 1, wherein said first and second wafers are bonded together at a temperature range below 600° C.

4. The method according to claim 1, which further includes forming an insulation layer between said p-electrode and said mesa stripe.

5. The method according to claim 1, which further includes polishing said n-InP substrate to a thickness of approximately 100 micrometers.

6. The method according to claim 2, wherein said first and second wafers are bonded together at a temperature range below 600° C.

7. The method according to claim 2, wherein said third wafer and said first united wafer are bonded together at a temperature range below 600° C.

8. The method according to claim 2, which further includes forming an insulation layer between said p-electrode and said mesa stripe.

9. The method according to claim 2, which further includes polishing said n-InP substrate to a thickness of approximately 100 micrometers.

* * * * *